(12) United States Patent
Matsuo et al.

(10) Patent No.: US 11,569,795 B2
(45) Date of Patent: Jan. 31, 2023

(54) RESONATOR DEVICE, RESONATOR MODULE, ELECTRONIC APPARATUS, AND VEHICLE

(71) Applicant: SEIKO EPSON CORPORATION, Tokyo (JP)

(72) Inventors: Atsushi Matsuo, Shiojiri (JP); Shinya Aoki, Minowa-machi (JP); Byonhaku Yu, Minowa-machi (JP); Ryuta Nishizawa, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 445 days.

(21) Appl. No.: 16/776,109

(22) Filed: Jan. 29, 2020

(65) Prior Publication Data
US 2020/0252050 A1 Aug. 6, 2020

(30) Foreign Application Priority Data
Jan. 31, 2019 (JP) .............................. JP2019-015322

(51) Int. Cl.
*H03H 9/19* (2006.01)
*H01L 41/09* (2006.01)
(Continued)

(52) U.S. Cl.
CPC .............. *H03H 9/19* (2013.01); *H01L 41/09* (2013.01); *H01L 41/18* (2013.01); *H01L 41/312* (2013.01);
(Continued)

(58) Field of Classification Search
CPC ........... H01L 41/18; H01L 41/09; H03H 9/10; H03H 9/1021; H03H 9/17; H03H 9/172;
(Continued)

(56) References Cited

U.S. PATENT DOCUMENTS

2011/0260586 A1* 10/2011 Kawase ................... H03H 9/21
310/365
2013/0057355 A1* 3/2013 Yoshida ............... H03H 9/1021
331/158
(Continued)

FOREIGN PATENT DOCUMENTS

JP 11-088104 3/1999
JP 2000-332571 11/2000
(Continued)

*Primary Examiner* — J. San Martin
(74) *Attorney, Agent, or Firm* — Workman Nydegger

(57) ABSTRACT

A resonator device includes a quartz crystal substrate, a resonator element including a first excitation electrode arranged on a first surface of the quartz crystal substrate, a second excitation electrode arranged on a second surface of the quartz crystal substrate in opposition to the first excitation electrode, and first and second pad electrodes that are arranged on the first surface and are coupled to the first and second excitation electrodes, a base including a substrate and first and second interconnects arranged on the substrate, a first bonding member bonding the first pad electrode to the first interconnect, and a second bonding member bonding the second pad electrode to the second interconnect. The first and second bonding members are arranged such that a first imaginary line that passes through a centroid of the resonator element and is parallel to an X axis is interposed between the first and second bonding members. An angle $\theta 1$ formed between the first imaginary line and a second imaginary line passing through the first bonding member and the second bonding member is $100° < \theta 1 < 140°$.

16 Claims, 13 Drawing Sheets

(51) Int. Cl.
*H03B 5/32* (2006.01)
*H03H 9/10* (2006.01)
*H01L 41/312* (2013.01)
*H01L 41/18* (2006.01)
*H03H 9/17* (2006.01)

(52) U.S. Cl.
CPC ............... *H03B 5/32* (2013.01); *H03H 9/10* (2013.01); *H03H 9/1021* (2013.01); *H03H 9/17* (2013.01); *H03H 9/172* (2013.01)

(58) Field of Classification Search
CPC .... H03H 9/19; H03H 9/0557; H03H 9/02102; H03H 9/02133; H03H 9/0519
See application file for complete search history.

(56) References Cited

U.S. PATENT DOCUMENTS

| | | | |
|---|---|---|---|
| 2013/0193806 A1* | 8/2013 | Yoshida | H03H 9/0519 310/344 |
| 2014/0346930 A1* | 11/2014 | Kohda | H01L 41/0533 216/41 |
| 2018/0159501 A1* | 6/2018 | Ishikawa | H03H 9/1057 |
| 2020/0252048 A1* | 8/2020 | Fujii | H03H 9/10 |

FOREIGN PATENT DOCUMENTS

| | | |
|---|---|---|
| JP | 2011-229167 | 11/2011 |
| JP | 2012-195711 | 10/2012 |
| JP | 2017-055454 | 3/2017 |

\* cited by examiner

RESONATOR DEVICE, RESONATOR MODULE, ELECTRONIC APPARATUS, AND VEHICLE

The present application is based on, and claims priority from JP Application Serial Number 2019-015322, filed Jan. 31, 2019, the disclosure of which is hereby incorporated by reference herein in its entirety.

BACKGROUND

1. Technical Field

The present disclosure relates to a resonator device, a resonator module, an electronic apparatus, and a vehicle.

2. Related Art

A quartz crystal resonator element disclosed in JP-A-2011-229167 includes an AT cut quartz crystal substrate, a first excitation electrode arranged on the upper surface of the quartz crystal substrate, a second excitation electrode arranged on the lower surface of the quartz crystal substrate in opposition to the first excitation electrode, a first pad electrode and a second pad electrode arranged on the upper surface of the quartz crystal substrate, a first lead interconnect coupling the first excitation electrode to the first pad electrode, and a second lead interconnect coupling the second excitation electrode to the second pad electrode. The quartz crystal resonator element is attached to a target object through conductive bonding members in the first pad electrode and the second pad electrode.

In the quartz crystal resonator element of JP-A-2011-229167, the first and second pad electrodes are arranged along line segments inclined at 60° with respect to the X axes (electrical axes) of quartz crystals passing through the centers of the first and second excitation electrodes. By arranging the first and second pad electrodes in such a manner, the quartz crystal resonator element is unlikely to be affected by stress and can exhibit excellent resonance characteristics. However, in such arrangement, the first and second pad electrodes are arranged at biased positions on in the quartz crystal substrate in plan view. Thus, for example, the quartz crystal resonator element is likely to be deformed by external shock and the like, and the resonance characteristics may be decreased.

SUMMARY

A resonator device according to an application example includes a quartz crystal substrate including a first surface and a second surface that are in a front-rear relationship with each other and are provided along an X axis which is an electrical axis, a resonator element including a first excitation electrode arranged on the first surface, a second excitation electrode arranged on the second surface in opposition to the first excitation electrode, a first pad electrode that is arranged on the first surface and is electrically coupled to the first excitation electrode, and a second pad electrode that is arranged on the first surface and is electrically coupled to the second excitation electrode, a base including a substrate and a first interconnect and a second interconnect arranged on the substrate, and a first bonding member bonding the first pad electrode to the first interconnect, and a second bonding member bonding the second pad electrode to the second interconnect. In plan view of the quartz crystal substrate, when a straight line that passes through a centroid of the resonator element and is parallel to the X axis is a first imaginary line, the first bonding member is positioned on one side of the first imaginary line in the plan view, and the second bonding member overlaps with the first imaginary line or is positioned on another side of the first imaginary line in the plan view. In the plan view, when a straight line passing through the first bonding member and the second bonding member is a second imaginary line, and an angle formed between the first imaginary line and the second imaginary line is θ1, 40°<θ1<80° or 100°<θ1<140° is satisfied.

A resonator module according to another application example includes the resonator device.

An electronic apparatus according to another application example includes the resonator device.

A vehicle according to another application example includes the resonator device.

DESCRIPTION OF EXEMPLARY EMBODIMENTS

Hereinafter, a resonator device, a resonator module, an electronic apparatus, and a vehicle will be described in detail based on embodiments illustrated in the appended drawings.

First Embodiment

Figure 1:
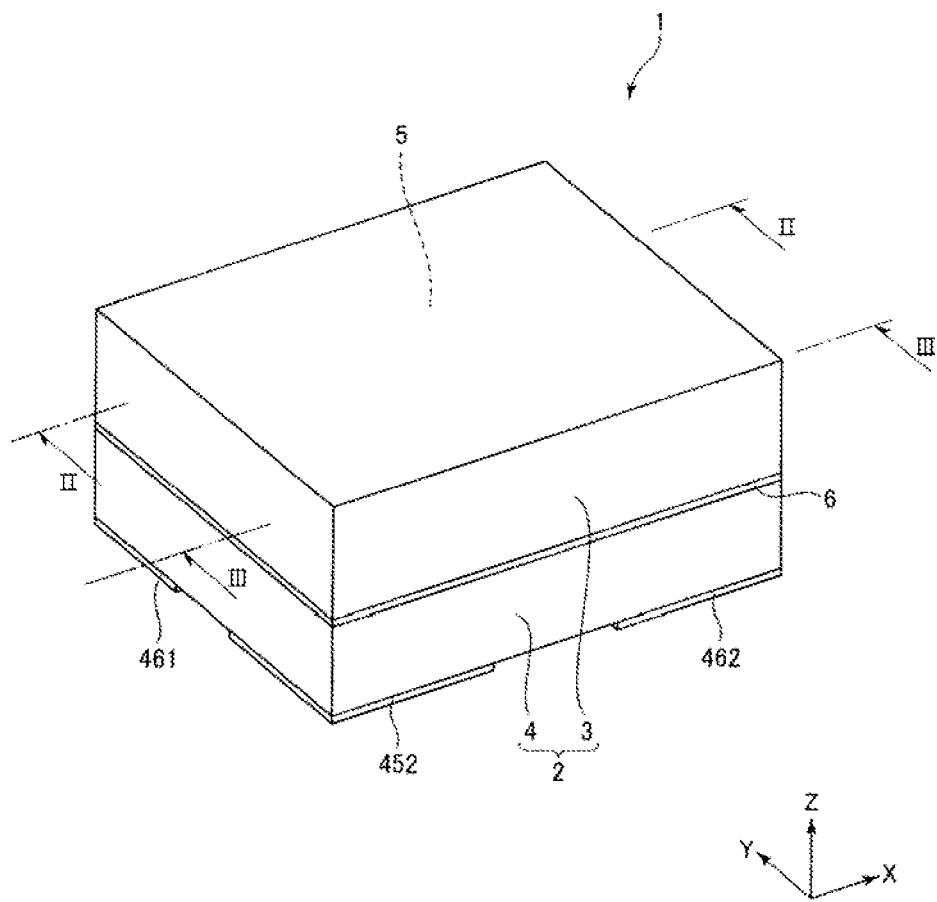
FIG. 1 is a perspective view illustrating a resonator device according to a first embodiment.
Figure 2:
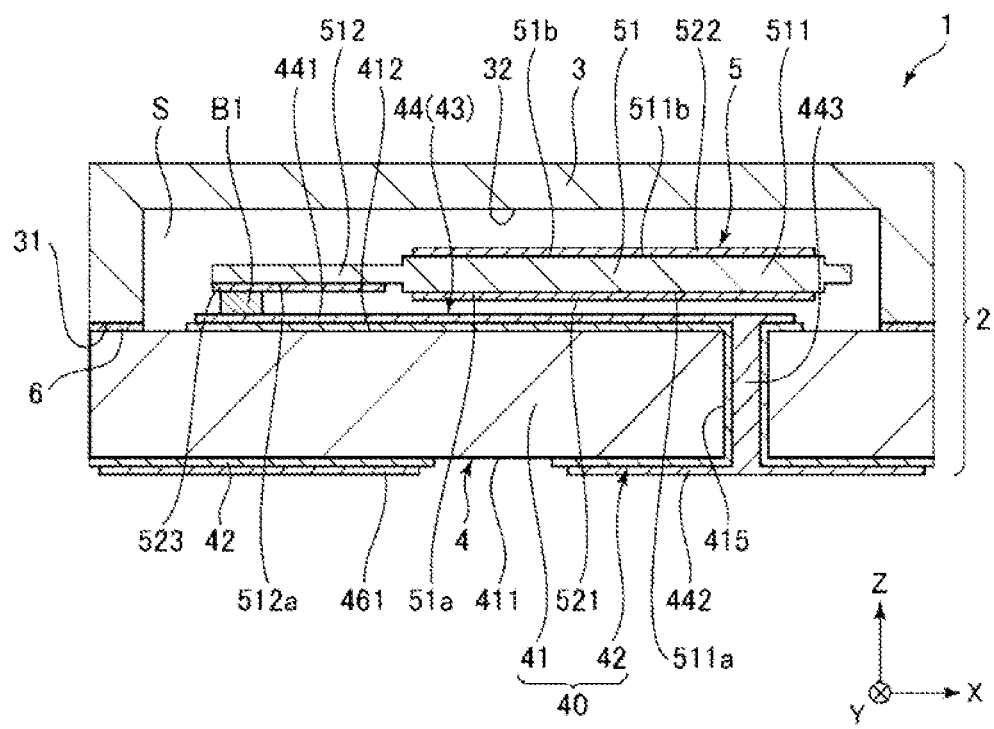
FIG. 2 is a II-II sectional view of FIG. 1.
Figure 3:
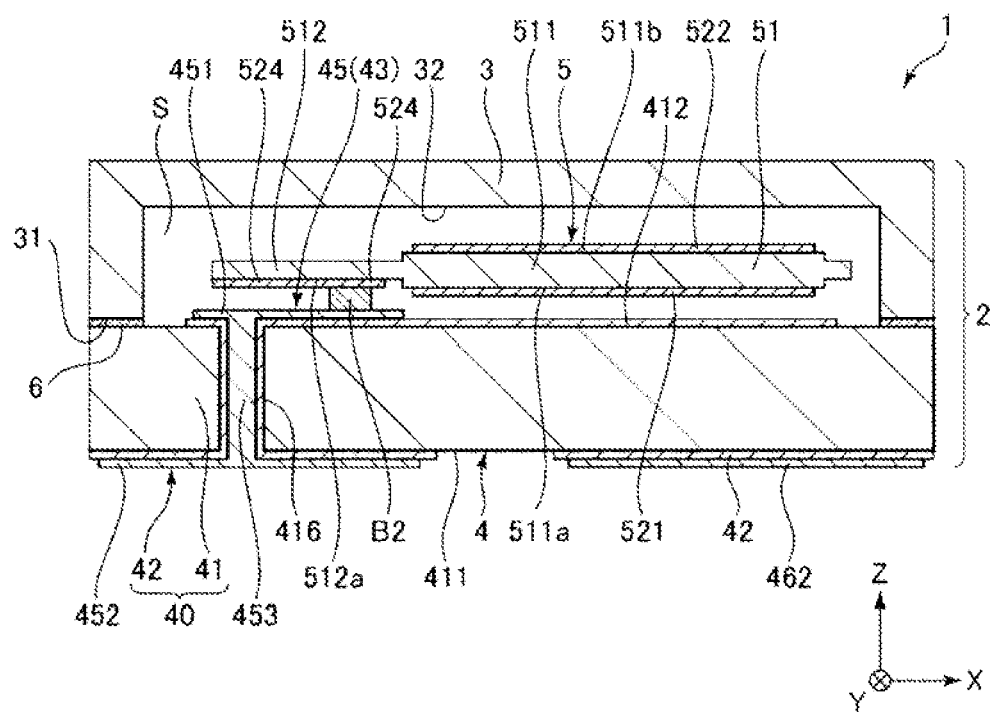
FIG. 3 is a III-III sectional view of FIG. 1.
Figure 4:
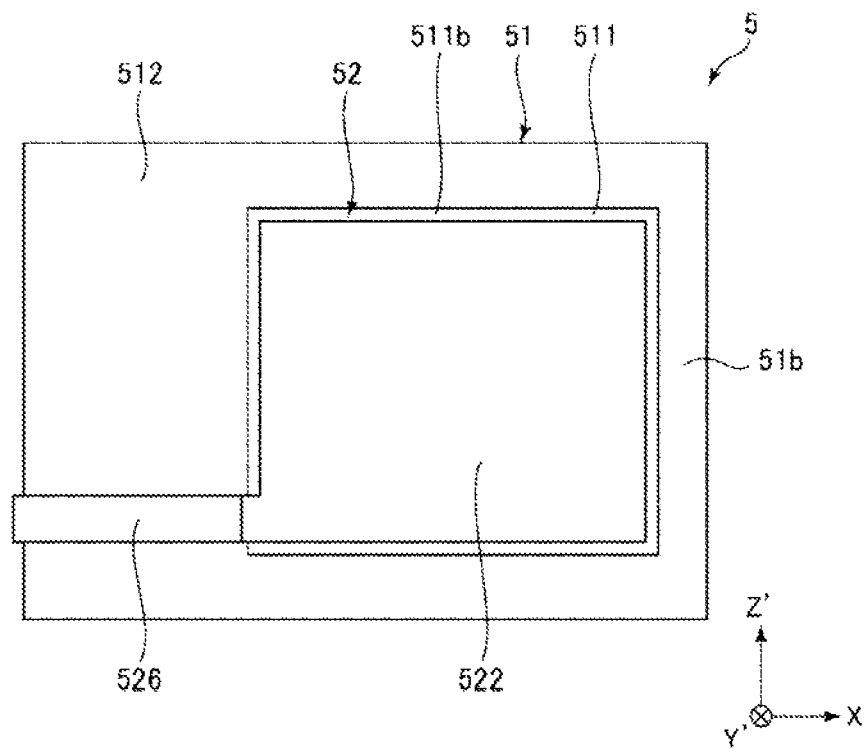
FIG. 4 is a top view of a resonator element.
Figure 5:
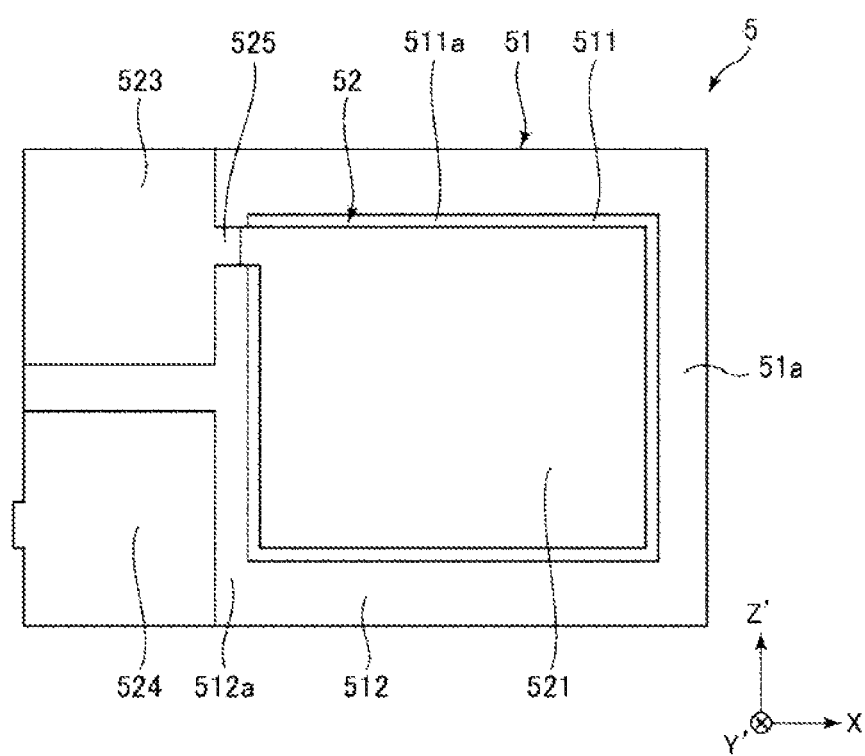
FIG. 5 is a see-through view of a lower surface of the resonator element seen from above.
Figure 6:
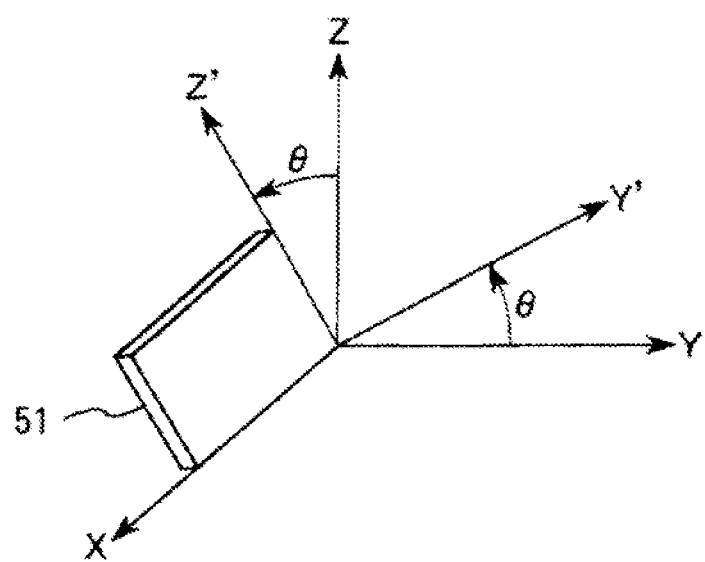
FIG. 6 is a diagram illustrating a cut angle of AT cut.
Figure 7:
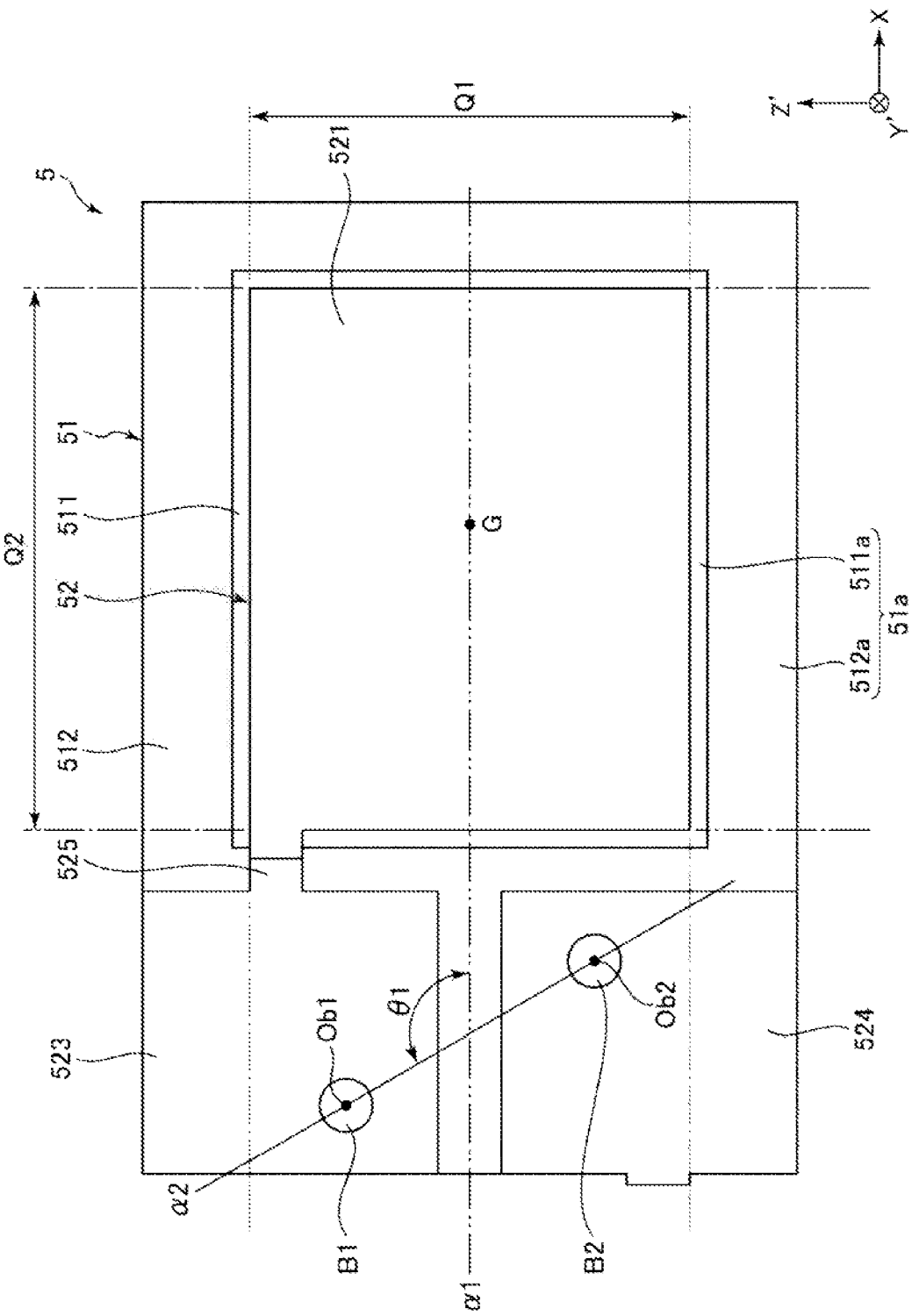
FIG. 7 is a see-through view of the lower surface of the resonator element seen from above.
Figure 8:
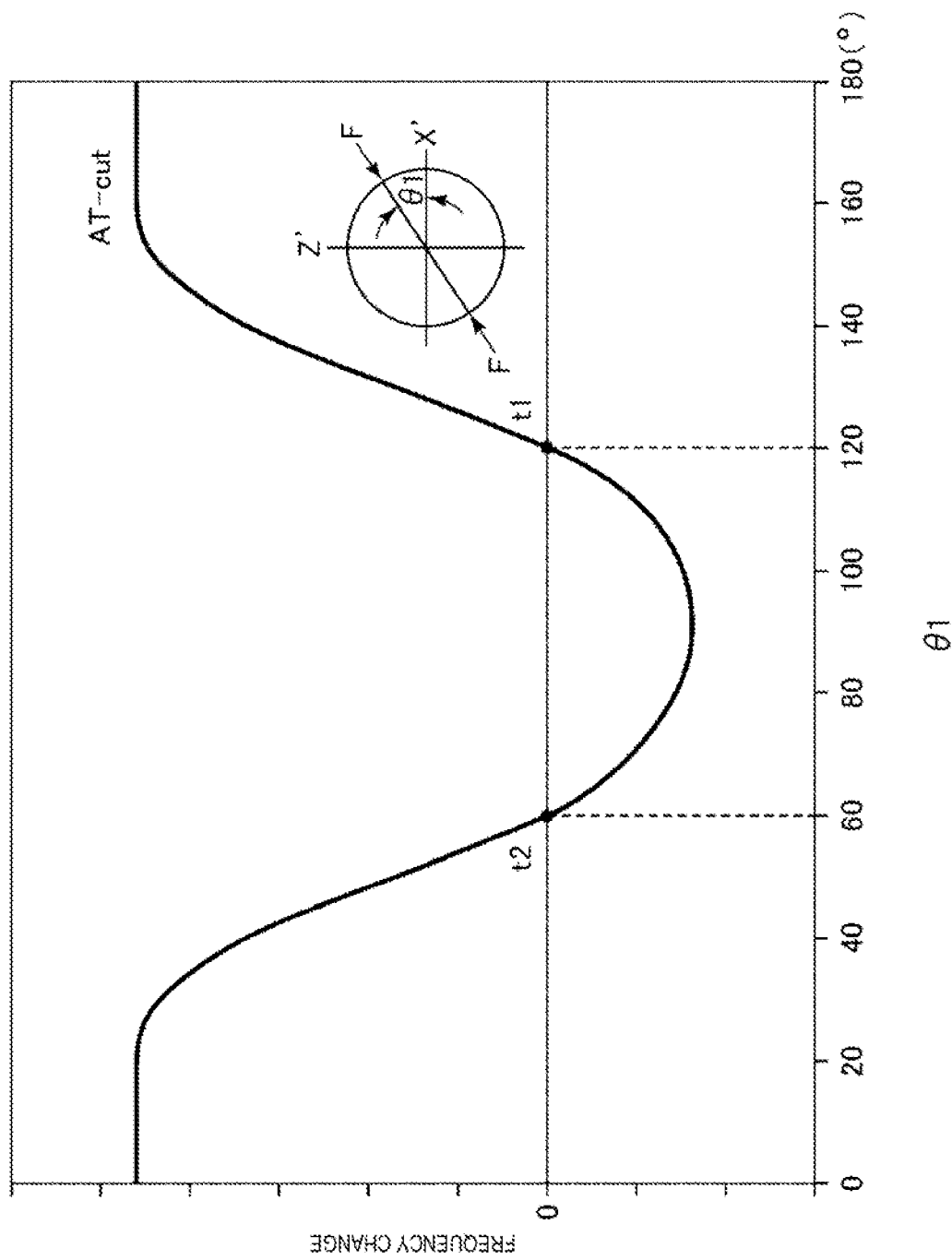
FIG. 8 is a graph illustrating a relationship between a direction of stress and a frequency change.
Figure 9:
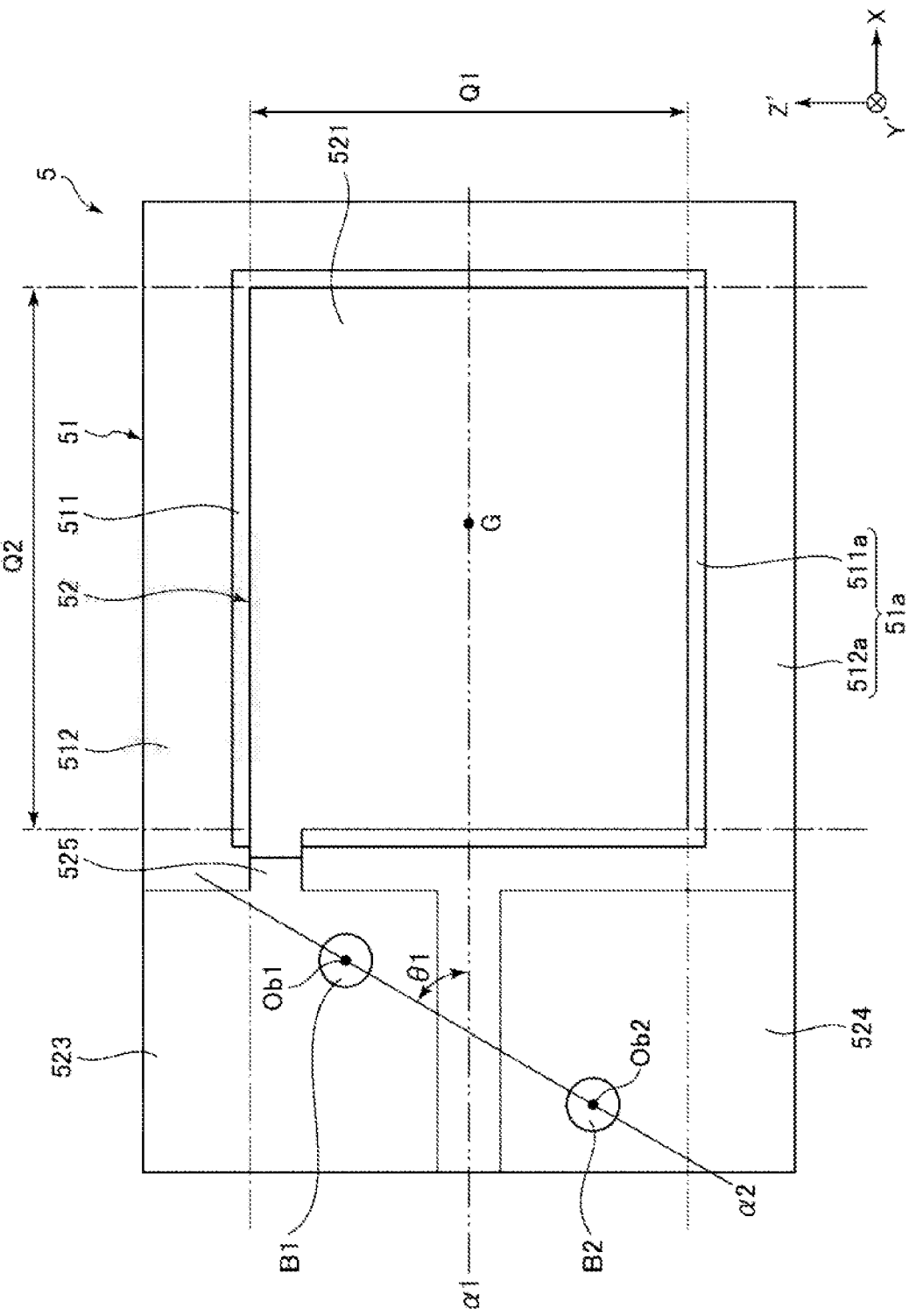
FIG. 9 illustrates a modification example of the resonator element and is a see-through view of the lower surface of the resonator element seen from above.

FIG. 1 is a perspective view illustrating a resonator device according to a first embodiment. FIG. 2 is a II-II sectional view of FIG. 1. FIG. 3 is a sectional view of FIG. 1. FIG. 4 is a top view of a resonator element. FIG. 5 is a see-through view of the lower surface of the resonator element seen from above. FIG. 6 is a diagram illustrating a cut angle of AT cut. FIG. 7 is a see-through view of the lower surface of the resonator element seen from above. FIG. 8 is a graph illustrating a relationship between the direction of stress and a frequency change. FIG. 9 illustrates a modification example of the resonator element and is a see-through view of the lower surface of the resonator element seen from above.

As illustrated in FIG. 1, the resonator device 1 includes a resonator element 5 and a package 2 accommodating the resonator element 5. As illustrated in FIG. 2 and FIG. 3, the package 2 includes a lid 3 of a box shape including a recess portion 32 accommodating the resonator element 5, and a base 4 of a plate shape that covers the opening of the recess portion 32 and is bonded to the lid 3. By covering the opening of the recess portion 32 with the base 4, an accommodation space S in which the resonator element 5 is accommodated is formed. The accommodation space S is airtight and is in a depressurized state or may be in a state closer to a vacuum. The atmosphere of the accommodation space S is not particularly limited and may be, for example, an atmosphere in which inert gas such as nitrogen or Ar is sealed, or may be in an atmospheric state or a pressurized state other than the depressurized state.

The base 4 includes a substrate 40 having insulating characteristics and an electrode 43 arranged on the substrate 40. The substrate 40 includes a base substrate 41 and an insulating film 42 arranged on the surface of the base substrate 41.

The base substrate 41 has a plate shape of which the plan view shape is a rectangle, and includes a lower surface 411 and an upper surface 412 that are in a front-rear relationship with each other. In addition, the base substrate 41 includes two through holes 415 and 416 that pass through the upper surface 412 and the lower surface 411.

The base substrate 41 is a semiconductor substrate. The semiconductor substrate is not particularly limited. For example, a silicon substrate, a germanium substrate, or a compound semiconductor substrate of GaP, GaAs, InP, or the like can be used. By using the semiconductor substrate as the base substrate 41, the resonator device 1 can be formed using a semiconductor process. Thus, the resonator device 1 can be accurately manufactured, and the size of the resonator device 1 can be reduced. In addition, a semiconductor circuit such as an oscillation circuit can be formed in the base 4, and the base 4 can be effectively used. Particularly, in the present embodiment, the silicon substrate is used as the base substrate 41. Accordingly, the base substrate 41 is inexpensive and is easily obtained.

The base substrate 41 is not limited to the semiconductor substrate. For example, a ceramic substrate or a glass substrate can be used. When the base substrate 41 has insulating characteristics like when the ceramic substrate or the glass substrate is used, the insulating film 42 may not be provided.

The insulating film 42 is arranged on the surface of the base substrate 41. However, the insulating film 42 is not arranged in the outer periphery portion of the upper surface 412, that is, a bonding portion for the lid 3. Thus, the outer periphery portion of the upper surface 412 is exposed from the insulating film 42. The insulating film 42 is configured with a silicon oxide film ($SiO_2$ film). A forming method for the insulating film 42 is not particularly limited. For example, the insulating film 42 may be formed by subjecting the surface of the base substrate 41 to thermal oxidation, or may be formed by plasma CVD using tetraethoxysilane (TEOS). The insulating film 42 is not particularly limited. For example, the insulating film 42 may be formed of an insulating resin material such as polyimide, or may be formed of a compound in which different types of materials are stacked.

The electrode 43 is arranged on the insulating film 42. The electrode 43 includes a first interconnect 44 and a second interconnect 45 that are separately arranged from each other. The first interconnect 44 includes an internal terminal 441 that is arranged on the upper surface of the substrate 40 and abuts the inside of the accommodation space S, an external terminal 442 that is arranged on the lower surface of the substrate 40 and abuts the outside of the package 2, and a through electrode 443 that is arranged in the through hole 415 and electrically couples the internal terminal 441 to the external terminal 442.

Similarly, the second interconnect 45 includes an internal terminal 451 that is arranged on the upper surface of the substrate 40 and abuts the inside of the accommodation space S, an external terminal 452 that is arranged on the lower surface of the substrate 40 and abuts the outside of the package 2, and a through electrode 453 that is arranged in the through hole 416 and electrically couples the internal terminal 451 to the external terminal 452.

In addition, the electrode 43 includes two dummy terminals 461 and 462 arranged on the lower surface of the substrate 40. The dummy terminals 461 and 462 do not have an electric function. For example, the dummy terminals 461 and 462 are disposed in order to increase the bonding strength between the package 2 and a target object. However, the functions of the dummy terminals 461 and 462 are not for limitation purposes.

The lid 3 has a box shape and includes the bottomed recess portion 32 that is open on a lower surface 31. The lid 3 is a semiconductor substrate. The semiconductor substrate is not particularly limited. For example, a silicon substrate, a germanium substrate, or a compound semiconductor substrate of GaP, GaAs, InP, or the like can be used. By using the semiconductor substrate as the lid 3, the resonator device 1 can be formed using a semiconductor process. Thus, the resonator device 1 can be accurately manufactured, and the size of the resonator device 1 can be reduced. Particularly, in the present embodiment, the silicon substrate is used as the lid 3. Accordingly, the lid 3 is inexpensive and is easily obtained. In addition, the materials of the base substrate 41 and the lid 3 can be matched, and a difference in coefficient of thermal expansion between the materials can be substantially equal to zero. Thus, the occurrence of thermal stress caused by thermal expansion is reduced, and the resonator device 1 has excellent resonance characteristics.

The lid 3 is not limited to the semiconductor substrate. For example, a ceramic substrate or a glass substrate can be used. A type of substrate different from the base substrate 41 may be used as the lid 3. Particularly, when the glass substrate having light-transmitting characteristics is used as the lid 3, a part of a first excitation electrode 521 can be removed by irradiating the resonator element 5 with a laser through the lid 3 after the manufacturing of the resonator device 1, and the frequency of the resonator element 5 can be adjusted.

The lid 3 is directly bonded to the upper surface 412 of the base substrate 41 through a bonding member 6 on the lower surface 31. In the present embodiment, the lid 3 and the base substrate 41 are bonded using diffusion bonding that uses diffusion between metals among types of direct bonding. Specifically, a metal film is disposed on the lower surface 31 of the lid 3, and a metal film is disposed on the upper surface 412 of the base substrate 41. The bonding member 6 is formed by diffusion-bonding the metal films. The lid 3 and the base substrate 41 are bonded through the bonding member 6. The bonding method is not for limitation purposes. For example, the lower surface 31 of the lid 3 and the upper surface 412 of the base substrate 41 may be activated by irradiating the lower surface 31 and the upper surface 412 with inert gas such as argon gas, and the lower surface 31 and the upper surface 412 may be directly bonded. In addition, bonding may be performed using various bonding members such as a resin adhesive and low melting point glass.

As illustrated in FIG. 4 and FIG. 5, the resonator element 5 includes an AT cut quartz crystal substrate 51 and an electrode 52 arranged on the surface of the quartz crystal substrate 51. The quartz crystal substrate 51 has a thickness shear resonance mode and has three-dimensional frequency-temperature characteristics. Thus, the resonator element 5 having excellent temperature characteristics is obtained.

As a simple description of the AT cut quartz crystal substrate 51, the quartz crystal substrate 51 includes crystal axes X, Y, and Z orthogonal to each other. The X axis, the Y axis, and the Z axis are referred to as an electrical axis, a mechanical axis, and an optical axis, respectively. As illustrated in FIG. 6, the quartz crystal substrate 51 is a "rotated Y cut quartz crystal substrate" that is cut along a plane to which the X-Z plane is rotated at a predetermined angle θ about the X axis. A substrate cut along a plane rotated at θ=35° 15' is referred to as an "AT cut quartz crystal substrate". Hereinafter, the Y axis and the Z axis rotated about the X axis in correspondence with the angle θ will be referred to as a Y' axis and a Z' axis. That is, the thickness of the quartz crystal substrate 51 is along the Y' axis, and the spread of the quartz crystal substrate 51 is in the direction of the X-Z' plane. The quartz crystal substrate 51 is not limited to the AT cut quartz crystal substrate as long as the quartz crystal substrate 51 can excite thickness shear resonance and the spread of the quartz crystal substrate 51 is in the direction of a plane including the X axis. Hereinafter, the tip end side of the arrow of each axis will be referred to as a "positive side", and the opposite side will be referred to as a "negative side".

As illustrated in FIG. 4 and FIG. 5, the exterior of the quartz crystal substrate 51 is a rectangle in plan view along the Y' axis, and the quartz crystal substrate 51 includes a lower surface 51a and an upper surface 51b that are in the front-rear relationship with each other. The quartz crystal substrate 51 is arranged with the lower surface 51a directed to the base 4 side. In the present embodiment, the quartz crystal substrate 51 has long edges along the X axis and short edges along the Z' axis. In addition, the quartz crystal substrate 51 includes a resonator 511 performing thickness shear resonance, and a support 512 that is positioned around the resonator 511 and is integrated with the resonator 511. The quartz crystal substrate 51 is of a mesa type. The resonator 511 is formed to have a greater thickness than the support 512. The resonator 511 protrudes to both sides of the Y' axis from the support 512.

The quartz crystal substrate 51 is not for limitation purposes. The quartz crystal substrate 51 may be of a flat type in which the resonator 511 and the support 512 have the same thickness, or may be of an inverted mesa type in which the resonator 511 is thinner than the support 512. In addition, a bevel process of grinding and planarizing the surrounding area of the quartz crystal substrate 51, or a convex process of forming the upper surface and the lower surface of the quartz crystal substrate 51 into convex surfaces may be performed. In the case of the mesa type, it may be configured that one of the lower surface 51a side and the upper surface 51b side protrudes. In the case of the inverse mesa type, it may be configured that one of the lower surface 51a side and the upper surface 51b side recedes.

The electrode 52 includes the first excitation electrode 521 arranged on a lower surface 511a of the resonator 511 and a second excitation electrode 522 arranged on an upper surface 511b of the resonator 511 in opposition to the first excitation electrode 521 with the resonator 511 interposed between the first excitation electrode 521 and the second excitation electrode 522. In addition, the electrode 52 includes a first pad electrode 523 and a second pad electrode 524 arranged on a lower surface 512a of the support 512, a first lead interconnect 525 coupling the first excitation electrode 521 to the first pad electrode 523, and a second lead interconnect 526 coupling the second excitation electrode 522 to the second pad electrode 524.

As illustrated in FIG. 2 and FIG. 3, the resonator element 5 is fixed on the upper surface of the base 4 by a conductive first bonding member B1 and second bonding member B2. The first bonding member B1 electrically couples the internal terminal 441 of the base 4 to the first pad electrode 523 of the resonator element 5. The second bonding member B2 electrically couples the internal terminal 451 of the base 4 to the second pad electrode 524 of the resonator element 5.

The first and second bonding members B1 and B2 are not particularly limited as long as the conductive bonding members B1 and B2 have both conductivity and bondability. For example, various metal bumps such as a gold bump, a silver bump, a copper bump, and a solder bump, and conductive adhesives obtained by dispersing a conductive filler such as a silver filler into various polyimide-based, epoxy-based, silicone-based, and acrylic-based adhesives can be used. When the former metal bumps are used as the first and second bonding members B1 and B2, the occurrence of gas from the first and second bonding members B1 and B2 can be reduced, and an environmental change in the accommodation space S, particularly, an increase in pressure, can be effectively reduced. Meanwhile, when the latter conductive adhesives are used as the first and second bonding members B1 and B2, the first and second bonding members B1 and B2 are softer than the metal bumps, and stress is unlikely to occur in the resonator element 5.

The overall configuration of the resonator device 1 is described thus far. Next, the arrangement of the first and second bonding members B1 and B2 that is one feature of the resonator device 1 will be described based on FIG. 7. Hereinafter, in plan view in the thickness direction of the resonator element 5, that is, along the Y' axis (hereinafter, simply referred to as "plan view"), an area formed by extending the first excitation electrode 521 along the X axis will be referred to as a first area Q1, and an area formed by extending the first excitation electrode 521 along the Z' axis will be referred to as a second area Q2. Each of the first bonding member B1 and the second bonding member B2 is arranged outside the second area Q2 and is positioned on the same side with respect to the second area Q2, that is, the negative side of the X axis in the present embodiment. By arranging the first and second bonding members B1 and B2 on the same side with respect to the second area Q2, the size of the resonator element 5 can be reduced.

Each of the first bonding member B1 and the second bonding member B2 is arranged inside the first area Q1. By arranging the first and second bonding members B1 and B2 inside the first area Q1, the size of the resonator element 5 can be reduced.

When an imaginary line that passes through a centroid G of the resonator element 5 and is parallel to the X axis in plan view is denoted by a first imaginary line α1, the first bonding member B1 is positioned on one side of the first imaginary line α1, that is, the positive side of the Z' axis in the present embodiment. The second bonding member B2 is positioned on the other side of the first imaginary line α1, that is, the negative side of the Z' axis in the present embodiment. When an imaginary line that passes through the first bonding member B1 and the second bonding member B2 in plan view is denoted by a second imaginary line α2, the second imaginary line α2 is inclined with respect to the first imaginary line α1, that is, the X axis. By arranging the first and second bonding members B1 and B2 in such a manner, the first and second bonding members B1 and B2 can be arranged separately from each other in the longitudinal direction and the short direction of the resonator element 5. Thus, the resonator element 5 can be supported in a stable attitude in a well-balanced manner.

An angle θ1 formed between the first imaginary line α1 and the second imaginary line α2 satisfies a relationship 100°<θ1<140°. Accordingly, the stress sensitivity (frequency change/stress) of the resonator element 5 is sufficiently decreased. That is, the frequency change caused by stress is sufficiently decreased. Thus, for example, even when thermal stress caused by a difference in coefficient of thermal expansion between the base substrate 41 and the quartz crystal substrate 51 is applied to the resonator element 5, furthermore, regardless of the magnitude of the thermal stress, the frequency characteristics of the resonator element 5 can be almost constantly maintained. Accordingly, the resonator device 1 has stable resonance characteristics.

Hereinafter, the reason will be simply described. FIG. 8 is a graph illustrating a relationship between the direction of stress F and the frequency change caused by received stress. From FIG. 8, it is perceived that when the direction of the stress is inclined at approximately 120° from the X axis (=t1), the frequency change is equal to zero. Thus, as described above, by satisfying the relationship 100°<θ1<140°, the stress sensitivity of the resonator element 5 is sufficiently decreased, and the frequency change caused by the stress can be sufficiently reduced. While 100°<θ1<140° is not particularly for limitation purposes, 105°<θ1<135° may be desirable, and 110°<θ1<130° may be more desirable. Accordingly, the above effect can be more noticeably exhibited.

Particularly, in the present embodiment, the base substrate 41 to which the resonator element 5 is attached through the first and second bonding members B1 and B2 is configured with a silicon substrate. The linear expansion coefficient of silicon is 2.8 ppm/° C. The linear expansion coefficient of quartz crystal along the X axis is 13.7 ppm/° C., and the linear expansion coefficient of quartz crystal along the Z' axis is 11.6 ppm/° C. Accordingly, since silicon and quartz crystal have significantly different linear expansion coefficients, it is configured that thermal stress is likely to be applied to the resonator element 5 in the resonator device 1 of the present embodiment, and the magnitude of the thermal stress is likely to be increased. Thus, the effect is further increased by satisfying 40°<θ1<80°. For example, the linear expansion coefficient of a ceramic substrate applicable to the base substrate 41 is 7.0 ppm/° C., and the difference in linear expansion coefficient between the ceramic substrate and quartz crystal is less than the difference between silicon and quartz crystal. Thus, thermal stress is unlikely to be applied to the resonator element 5, and the magnitude of the thermal stress is also unlikely to be increased. Accordingly, it can be said that the effect can be particularly exhibited when the base substrate 41 is a silicon substrate.

As illustrated in FIG. 8, it is perceived that when the direction of the stress F is inclined at 60° from the X axis (=t2), the frequency change is also equal to zero. Thus, as a modification example of the present embodiment, as illustrated in FIG. 9, the first and second bonding members B1 and B2 may be arranged such that 40°<θ1<80° is satisfied. Even by such arrangement, the stress sensitivity of the resonator element 5 is sufficiently decreased, and the frequency change caused by stress can be sufficiently reduced. While 40°<θ1<80° is not particularly for limitation purposes, 45°<θ1<75° may be desirable, and 50°<θ1<70° may be more desirable. Accordingly, the above effect can be more noticeably exhibited.

While the second imaginary line α2 may overlap with or be tangent to the first bonding member B1 and the second bonding member B2, the second imaginary line α2 may be preferably an imaginary line passing through a center Ob1 of the first bonding member B1 and a center Ob2 of the second bonding member B2. Accordingly, the above effect can be more securely exhibited.

The resonator device 1 is described thus far. As described above, the resonator device 1 includes the quartz crystal substrate 51 that includes the lower surface 51a as a first surface and the upper surface 51b as a second surface along the X axis which is the electrical axis, the lower surface 51a and the upper surface 51b having the front-rear relationship with each other; the resonator element 5 that includes the first excitation electrode 521 arranged on the lower surface 51a, the second excitation electrode 522 arranged on the upper surface 51b in opposition to the first excitation electrode 521, the first pad electrode 523 which is arranged on the lower surface 51a and is electrically coupled to the first excitation electrode 521, and the second pad electrode 524 which is arranged on the lower surface 51a and is electrically coupled to the second excitation electrode 522; the base 4 that includes the substrate 40 and the first interconnect 44 and the second interconnect 45 arranged on the substrate 40; the first bonding member B1 bonding the first pad electrode 523 to the first interconnect 44; and the second bonding member B2 bonding the second pad electrode 524 to the second interconnect 45. When a straight line that passes through the centroid G of the resonator element 5 and is parallel to the X axis in plan view of the quartz crystal substrate 51 is denoted by the first imaginary line α1, the first bonding member B1 is positioned on one side of the first imaginary line α1 in plan view, and the second bonding member B2 is positioned on the other side of the first imaginary line α1 in plan view. When a straight line passing through the first bonding member B1 and the second bonding member B2 in plan view is denoted by the second imaginary line α2, and the angle θ1 formed between the first imaginary line α1 and the second imaginary line α2 is denoted by θ1, 40°<θ1<80° or 100°<θ1<140° is satisfied.

By having such a configuration, the stress sensitivity of the resonator element 5 is sufficiently decreased. Thus, even when stress is applied to the resonator element 5, furthermore, regardless of the magnitude of the stress, the frequency characteristics of the resonator element 5 can be almost constantly maintained. Accordingly, the resonator device 1 has stable resonance characteristics. In addition, the first and second bonding members B1 and B2 can be positioned separately from each other along the X axis and the Z' axis, and the first and second bonding members B1 and B2 are not arranged on one side of the Z' axis of the resonator element 5. Thus, the resonator element 5 can be supported in a stable attitude in a well-balanced manner. Accordingly, the resonator element 5 is unlikely to be deformed by shock and the like and can exhibit more stable resonance characteristics.

As described above, the resonator device 1 may satisfy 45°<θ1<75° or 105°<θ1<135°. Accordingly, the above effect can be more noticeably exhibited, and the resonator device 1 has more stable resonance characteristics.

As described above, when the area formed by extending the first excitation electrode 521 along the X axis in plan view is denoted by the first area Q1, each of the first bonding member B1 and the second bonding member B2 is positioned inside the first area Q1. Accordingly, the size of the resonator device 1 can be reduced.

As described above, when the area formed by extending the first excitation electrode 521 in a direction orthogonal to the X axis, that is, along the Z' axis, is denoted by the second area Q2, each of the first bonding member B1 and the second bonding member B2 is positioned outside the second area Q2 and is positioned on the same side with respect to the second area Q2, that is, on the negative side of the X axis in the present embodiment. Accordingly, the size of the resonator device 1 can be reduced.

As described above, the substrate 40 includes a silicon substrate. Since silicon and quartz crystal have significantly different linear expansion coefficients, it is configured that thermal stress is likely to be applied to the resonator element 5 in the resonator device 1, and the magnitude of the thermal stress is likely to be increased. Accordingly, it is configured that the above effect more contributes.

Second Embodiment

Figure 10:
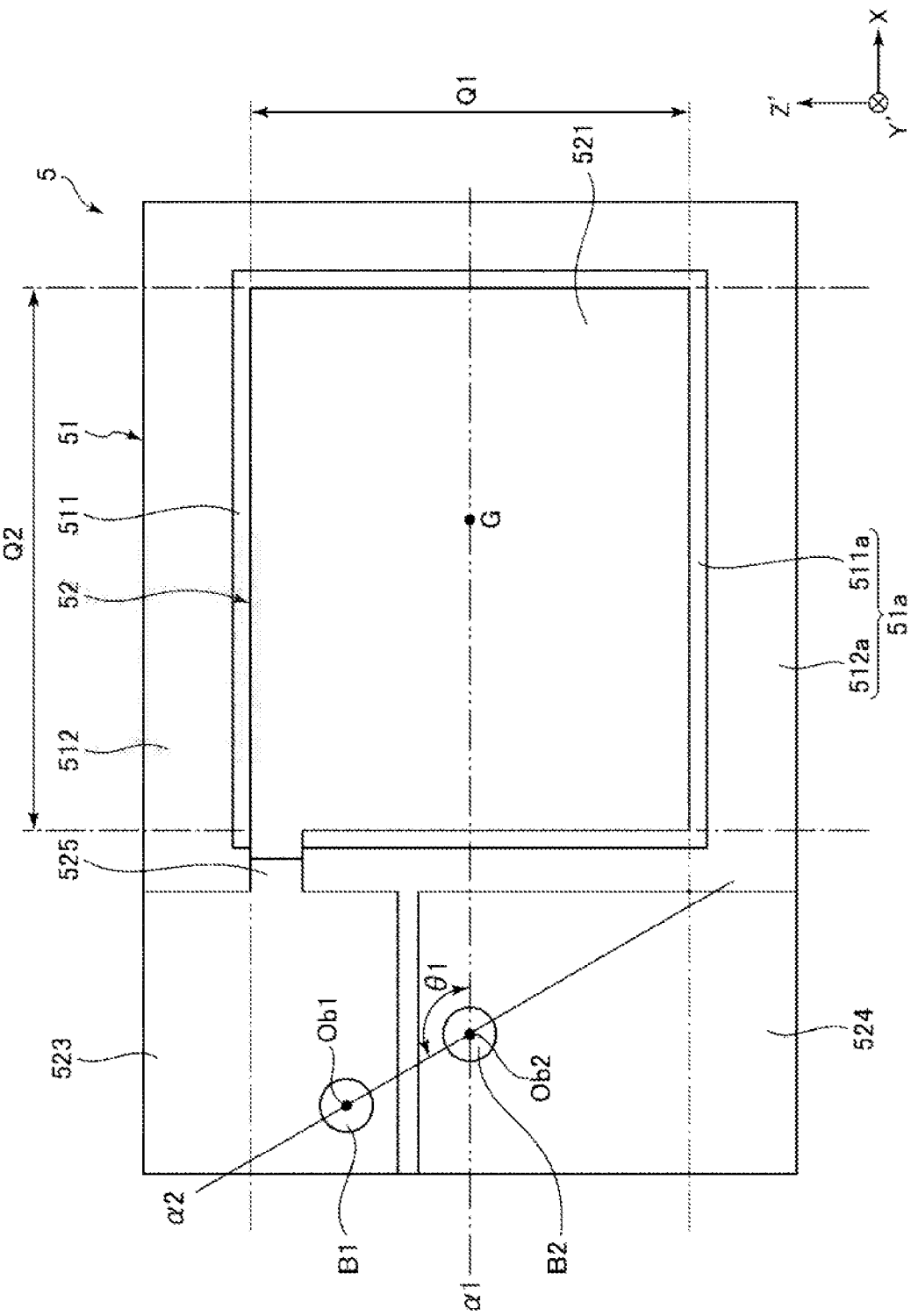
FIG. 10 is a see-through view of a lower surface of a resonator element of a second embodiment seen from above.
Figure 11:
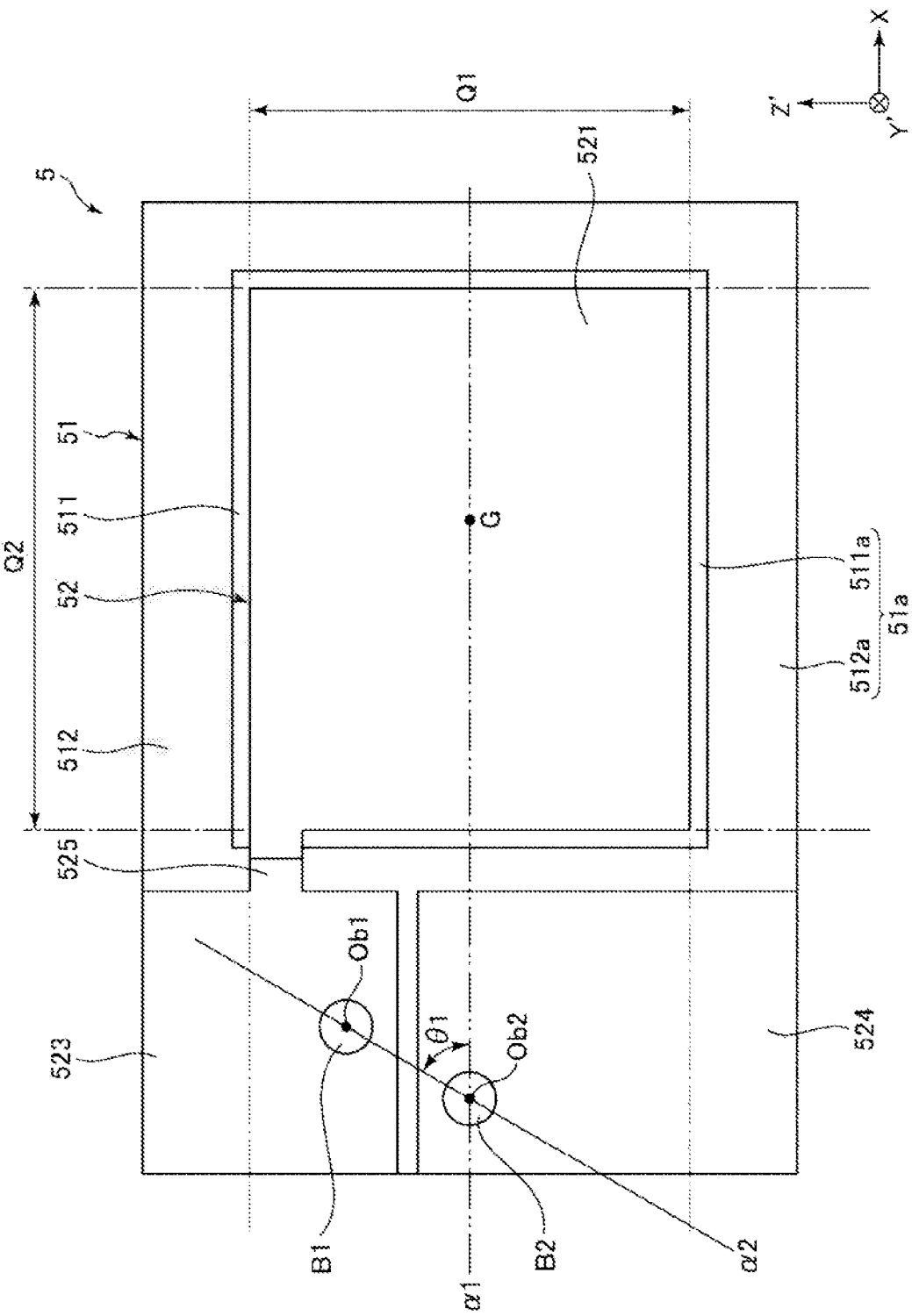
FIG. 11 illustrates a modification example of the resonator element and is a see-through view of the lower surface of the resonator element seen from above.

FIG. 10 is a see-through view of the lower surface of a resonator element of a second embodiment seen from above. FIG. 11 illustrates a modification example of the resonator element and is a see-through view of the lower surface of the resonator element seen from above.

The resonator device 1 according to the present embodiment is the same as the resonator device 1 of the first embodiment except that the arrangement of the first and second bonding members B1 and B2 is different. In the following description, differences between the resonator device 1 of the second embodiment and the first embodiment will be mainly described, and the same matters will not be described. In FIG. 10 and FIG. 11, the same configurations as the above embodiment are designated by the same reference signs.

As illustrated in FIG. 10, the first bonding member B1 is positioned on one side of the first imaginary line α1, that is, the positive side of the Z' axis in the present embodiment. The second bonding member B2 overlaps with the first imaginary line α1 in plan view. The angle θ1 formed between the first imaginary line α1 and the second imaginary line α2 satisfies the relationship 100°<θ<140°. Even by such arrangement, the stress sensitivity of the resonator element 5 is sufficiently decreased, and the frequency change caused by stress can be sufficiently reduced. As a modification example of the present embodiment, as illustrated in FIG. 11, the first and second bonding members B1 and B2 may be arranged such that 40°<θ1<80° is satisfied. The same effect as the present embodiment can be exhibited.

As described thus far, in the resonator device 1 of the present embodiment, when a straight line that passes through the centroid G of the resonator element 5 and is parallel to the X axis in plan view of the quartz crystal substrate 51 is denoted by the first imaginary line α1, the first bonding member B1 is positioned on one side of the first imaginary line α1 in plan view, and the second bonding member B2 overlaps with the first imaginary line α1 in plan view. When the straight line passing through the first bonding member B1 and the second bonding member B2 in plan view is denoted by the second imaginary line α2, and the angle formed between the first imaginary line α1 and the second imaginary line α2 is denoted by θ1, 40°<θ1<80° or 100°<θ1<140° is satisfied.

By having such a configuration, the stress sensitivity of the resonator element 5 is sufficiently decreased. Thus, even when stress is applied to the resonator element 5, furthermore, regardless of the magnitude of the stress, the frequency characteristics of the resonator element 5 can be almost constantly maintained. Accordingly, the resonator device 1 has stable resonance characteristics. In addition, the first and second bonding members B1 and B2 can be positioned separately from each other along the X axis and the Z' axis, and the first and second bonding members B1 and B2 are not arranged on one side of the Z' axis of the resonator element 5. Thus, the resonator element 5 can be supported in a stable attitude in a well-balanced manner. Accordingly, the resonator element 5 is unlikely to be deformed by shock and the like and can exhibit more stable resonance characteristics.

According to the second embodiment, the same effect as the first embodiment can be exhibited.

Third Embodiment

Figure 12:
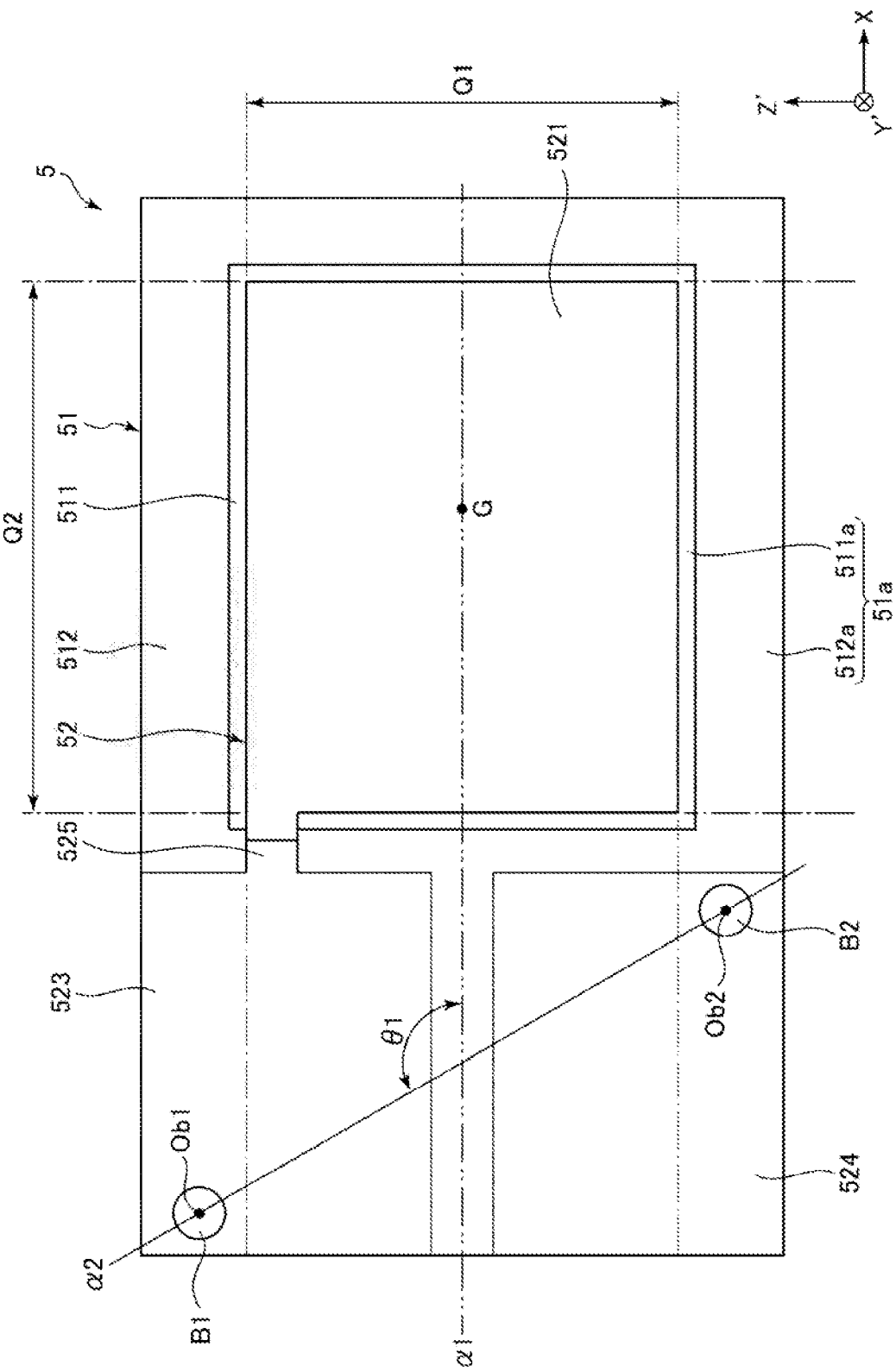
FIG. 12 is a see-through view of a lower surface of a resonator element of a third embodiment seen from above.

FIG. 12 is a see-through view of the lower surface of a resonator element of a third embodiment seen from above.

The resonator device 1 according to the present embodiment is the same as the resonator device 1 of the first embodiment except that the arrangement of the first and second bonding members B1 and B2 is different. In the following description, differences between the resonator device 1 of the third embodiment and the first embodiment will be mainly described, and the same matters will not be described. In FIG. 12, the same configurations as the above embodiments are designated by the same reference signs.

As illustrated in FIG. 12, the first bonding member B1 is positioned outside the first area Q1, that is, the positive side of the Z' axis with respect to the first area Q1 in the present embodiment. The second bonding member B2 is positioned outside the first area Q1, that is, the negative side of the Z' axis with respect to the first area Q1 in the present embodiment. That is, the first and second bonding members B1 and B2 are arranged with the first area Q1 interposed therebetween. By having such a configuration, the first and second bonding members B1 and B2 can be sufficiently separately arranged, and the resonator element 5 can be attached to the base 4 in a more stable attitude.

As described thus far, in the resonator device 1 of the present embodiment, when the area formed by extending the first excitation electrode 521 along the X axis in plan view is denoted by the first area Q1, the first bonding member B1 and the second bonding member B2 are positioned outside the first area Q1 and are arranged with the first area Q1 interposed therebetween. By having such a configuration, the first and second bonding members B1 and B2 can be sufficiently separately arranged, and the resonator element 5 can be attached to the base 4 in a more stable attitude.

According to the third embodiment, the same effect as the first embodiment can be exhibited. As a modification example of the present embodiment, for example, any one of the first and second bonding members B1 and B2 may be positioned in the first area Q1.

Fourth Embodiment

Figure 13:
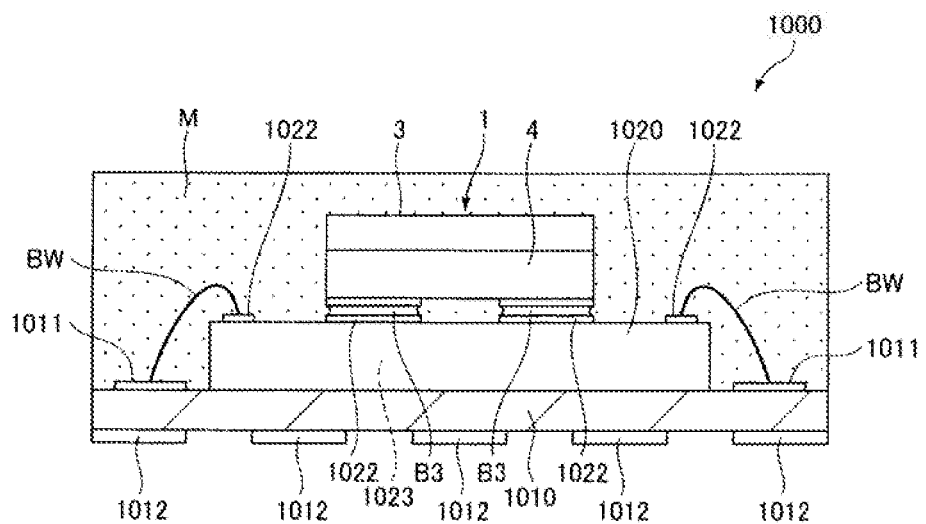
FIG. 13 is a sectional view illustrating a resonator module according to a fourth embodiment.

FIG. 13 is a sectional view illustrating a resonator module according to a fourth embodiment.

A resonator module 1000 illustrated in FIG. 13 includes a support substrate 1010, a circuit substrate 1020 mounted on the support substrate 1010, the resonator device 1 mounted on the circuit substrate 1020, and a mold material M molding the circuit substrate 1020 and the resonator device 1.

For example, the support substrate 1010 is an interposer substrate. A plurality of coupling terminals 1011 are arranged on the upper surface of the support substrate 1010. A plurality of mount terminals 1012 are arranged on the lower surface of the support substrate 1010. An internal interconnect, not illustrated, is arranged in the support substrate 1010. Each coupling terminal 1011 is electrically coupled to the corresponding mount terminal 1012 through the internal interconnect. The support substrate 1010 is not particularly limited. For example, a silicon substrate, a ceramic substrate, a resin substrate, a glass substrate, or a glass epoxy substrate can be used.

The circuit substrate 1020 is bonded to the upper surface of the support substrate 1010 through a die attaching material. In the circuit substrate 1020, an oscillation circuit 1023 that generates the frequency of a reference signal such as a clock signal by oscillating the resonator element 5 of the resonator device 1 is formed. A plurality of terminals 1022 electrically coupled to the oscillation circuit are arranged on the upper surface of the oscillation circuit 1023. A part of the terminals 1022 is electrically coupled to the coupling terminals 1011 through bonding wires BW. A part of the terminals 1022 are electrically coupled to the resonator device 1 through a conductive bonding member B3 such as solder.

The mold material M molds the circuit substrate 1020 and the resonator device 1 and protects the circuit substrate 1020 and the resonator device 1 from moisture, dust, shock, and the like. The mold material M is not particularly limited. For example, a thermosetting type epoxy resin can be used, and the molding can be performed using a transfer molding method.

The resonator module 1000 includes the resonator device 1. Thus, the effect of the resonator device 1 can be accomplished, and excellent reliability can be exhibited.

Fifth Embodiment

Figure 14:
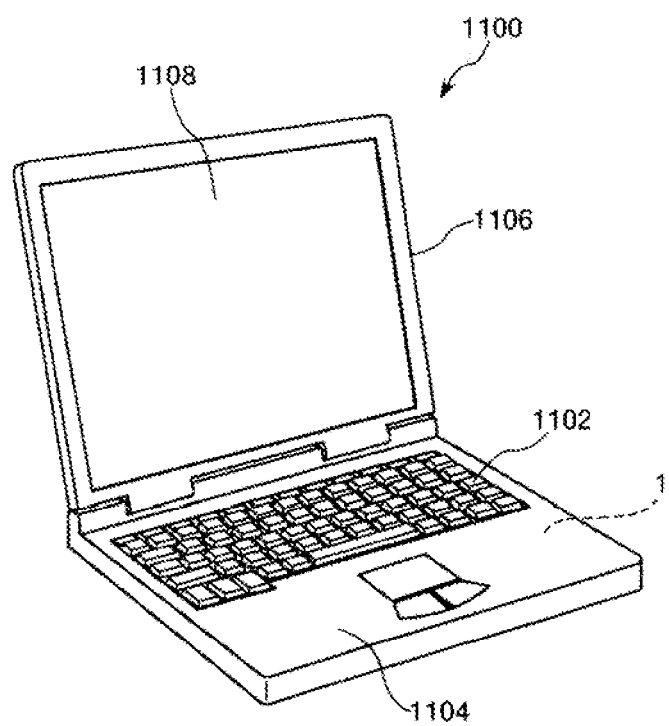
FIG. 14 is a perspective view illustrating an electronic apparatus according to a fifth embodiment.

FIG. 14 is a perspective view illustrating an electronic apparatus according to a fifth embodiment.

The electronic apparatus including the resonator device according to the present disclosure is applied to a laptop type personal computer 1100 illustrated in FIG. 14. In FIG. 14, the personal computer 1100 is configured with a main body portion 1104 including a keyboard 1102, and a display unit 1106 including a display 1108. The display unit 1106 is pivotably supported with respect to the main body portion 1104 through a hinge structure. For example, the resonator device 1 used as an oscillator is incorporated in the personal computer 1100.

The personal computer 1100 as the electronic apparatus includes the resonator device 1. Thus, the effect of the resonator device 1 can be accomplished, and high reliability can be exhibited.

Sixth Embodiment

Figure 15:
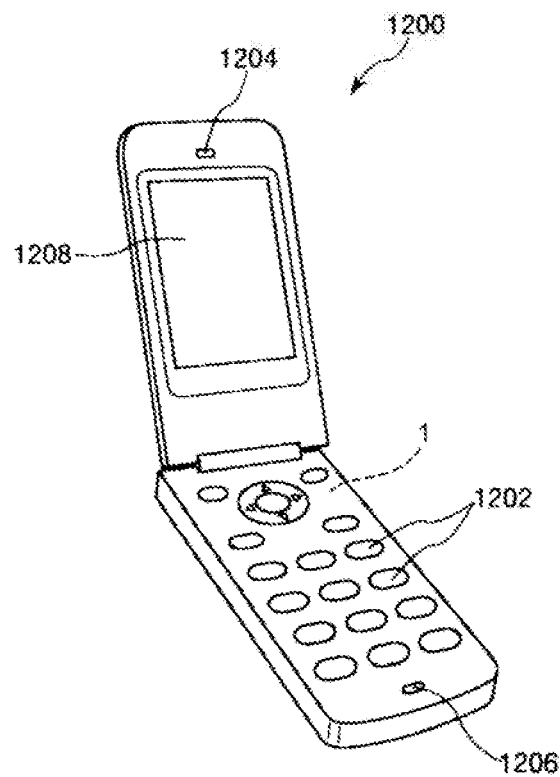
FIG. 15 is a perspective view illustrating an electronic apparatus according to a sixth embodiment.

FIG. 15 is a perspective view illustrating an electronic apparatus according to a sixth embodiment.

The electronic apparatus including the resonator device according to the present disclosure is applied to a mobile phone 1200 illustrated in FIG. 15. The mobile phone 1200 includes an antenna, not illustrated, a plurality of operation buttons 1202, a receiver 1204, and a transmitter 1206. A display 1208 is arranged between the operation buttons 1202 and the receiver 1204. For example, the resonator device 1 used as an oscillator is incorporated in the mobile phone 1200.

The mobile phone 1200 as the electronic apparatus includes the resonator device 1. Thus, the effect of the resonator device 1 can be accomplished, and high reliability can be exhibited.

Seventh Embodiment

Figure 16:
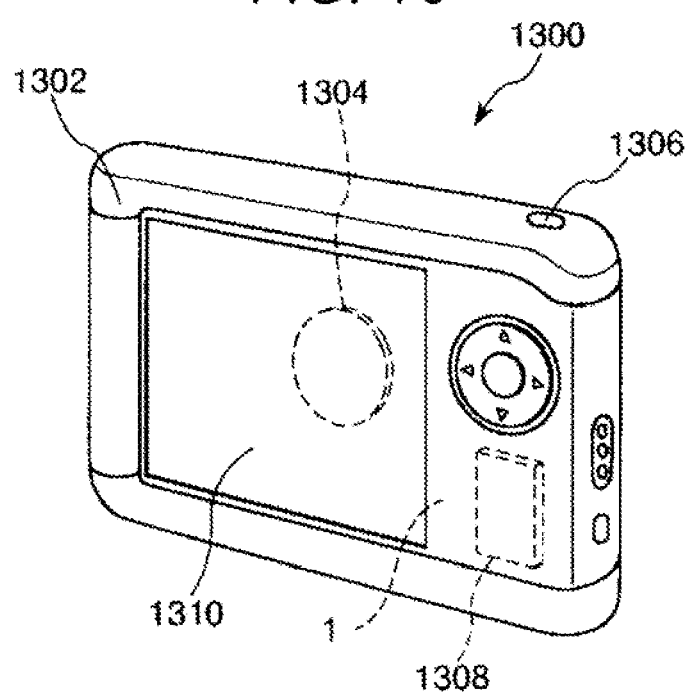
FIG. 16 is a perspective view illustrating an electronic apparatus according to a seventh embodiment.

FIG. 16 is a perspective view illustrating an electronic apparatus according to a seventh embodiment of the present disclosure.

The electronic apparatus including the resonator device according to the present disclosure is applied to a digital still camera 1300 illustrated in FIG. 16. A display 1310 is disposed on the rear surface of a body 1302 and is configured to perform displaying based on an imaging signal of a CCD. The display 1310 functions as a finder that displays a subject as an electronic image. A light reception unit 1304 that includes an optical lens, a CCD, and the like is disposed on the front surface side (in FIG. 16, the rear surface side) of the body 1302. When a person performing imaging checks the subject image displayed on the display 1310 and presses a shutter button 1306, the imaging signal of the CCD at that time point is transferred to and stored in a memory 1308. For example, the resonator device 1 used as an oscillator is incorporated in the digital still camera 1300.

The digital still camera 1300 as the electronic apparatus includes the resonator device 1. Thus, the effect of the resonator device 1 can be accomplished, and high reliability can be exhibited.

In addition to the personal computer, the mobile phone, and the digital still camera, for example, the electronic apparatus according to the present disclosure can be applied to a smartphone, a tablet terminal, a timepiece (including a smart watch), an ink jet type ejecting apparatus (for example, an ink jet printer), a desktop type personal computer, a television, a wearable terminal such as a head-mounted display (HMD), a video camera, a video tape recorder, a car navigation apparatus, a pager, an electronic organizer (including an electronic organizer having a communication function), an electronic dictionary, an electronic calculator, an electronic game apparatus, a word processor, a workstation, a videophone, a security television monitor, an electronic binocular, a POS terminal, a medical apparatus (for example, an electronic thermometer, a blood pressure meter, a blood glucose meter, an electrocardiograph, an ultrasound diagnosis apparatus, and an electronic endoscope), a fishfinder, various measuring apparatuses, a mobile terminal base station apparatus, meters (for examples, meters of a vehicle, an aircraft, and a ship), a flight simulator, a network server, and the like.

Eighth Embodiment

Figure 17:
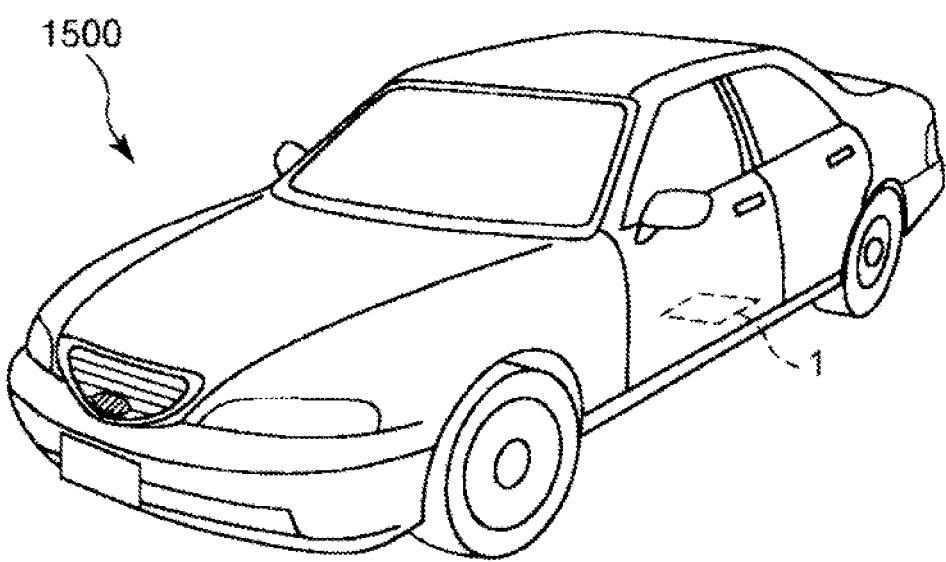
FIG. 17 is a perspective view illustrating a vehicle according to an eighth embodiment.

FIG. 17 is a perspective view illustrating a vehicle according to an eighth embodiment.

An automobile 1500 illustrated in FIG. 17 is an automobile to which the vehicle including the resonator device according to the present disclosure is applied. For example, the resonator device 1 used as an oscillator is incorporated in the automobile 1500. The resonator device 1 can be widely applied to keyless entry, an immobilizer, a car navigation system, a car air conditioner, an antilock brake system (ABS), an airbag, a tire pressure monitoring system (TPMS), engine control, a battery monitor of a hybrid automobile or an electric automobile, and an electronic control unit (ECU) such as a vehicle attitude control system.

The automobile 1500 as the vehicle includes the resonator device 1. Thus, the effect of the resonator device 1 can be accomplished, and high reliability can be exhibited.

The vehicle is not limited to the automobile 1500 and can be applied to an airplane, a ship, an unmanned transport vehicle (AGV), a biped robot, an unmanned airplane such as a drone, and the like.

While the resonator device, the resonator module, the electronic apparatus, and the vehicle of the present application example are described thus far based on the illustrated embodiments, the present disclosure is not limited to the embodiments. The configuration of each unit can be replaced with any configuration having the same function. Any other constituents may be added to the present disclosure. The present disclosure may be a combination of any two or more configurations in each of the embodiments.

What is claimed is:

1. A resonator device comprising:
a quartz crystal substrate including a first surface and a second surface that are in a front-rear relationship with each other and are provided along an X axis which is an electrical axis;
a resonator element including
a first excitation electrode arranged on the first surface,
a second excitation electrode arranged on the second surface in opposition to the first excitation electrode,
a first pad electrode that is arranged on the first surface and is electrically coupled to the first excitation electrode, and
a second pad electrode that is arranged on the first surface and is electrically coupled to the second excitation electrode;
a base including
a substrate, and
a first interconnect and a second interconnect arranged on the substrate;
a first bonding member bonding the first pad electrode to the first interconnect; and
a second bonding member bonding the second pad electrode to the second interconnect, wherein
in plan view of the quartz crystal substrate,
the first bonding member is positioned on one side of a first imaginary line,
the second bonding member overlaps with the first imaginary line or is positioned on the other side of the first imaginary line, and
$40° < \theta1 < 80°$ or $100° < \theta1 < 140°$, where
$\theta1$ is an angle formed between the first imaginary line and a second imaginary line,
the first imaginary line is a straight line that passes through a centroid of the resonator element and is parallel to the X axis in the plan view, and
the second imaginary line is a straight line passing through the first bonding member and the second bonding member, wherein in the plan view, the first bonding member and the second bonding member are positioned inside a first area formed by extending the first excitation electrode along the X axis.

2. The resonator device according to claim 1, wherein $45° < \theta1 < 75°$ or $105° < \theta1 < 135°$.

3. The resonator device according to claim 1, wherein the substrate includes a silicon substrate.

4. A resonator module comprising:
the resonator device according to claim 1; and
an oscillation circuit oscillating the resonator element.

5. An electronic apparatus comprising:
the resonator device according to claim 1.

6. A vehicle comprising:
the resonator device according to claim 1.

7. A resonator device comprising:
a quartz crystal substrate including a first surface and a second surface that are in a front-rear relationship with each other and are provided along an X axis which is an electrical axis;
a resonator element including
a first excitation electrode arranged on the first surface,
a second excitation electrode arranged on the second surface in opposition to the first excitation electrode,
a first pad electrode that is arranged on the first surface and is electrically coupled to the first excitation electrode, and
a second pad electrode that is arranged on the first surface and is electrically coupled to the second excitation electrode;
a base including
a substrate, and
a first interconnect and a second interconnect arranged on the substrate;
a first bonding member bonding the first pad electrode to the first interconnect; and
a second bonding member bonding the second pad electrode to the second interconnect, wherein
in plan view of the quartz crystal substrate,
the first bonding member is positioned on one side of a first imaginary line,
the second bonding member overlaps with the first imaginary line or is positioned on the other side of the first imaginary line, and
$40° < \theta1 < 80°$ or $100° < \theta1 < 140°$, where
$\theta1$ is an angle formed between the first imaginary line and a second imaginary line,
the first imaginary line is a straight line that passes through a centroid of the resonator element and is parallel to the X axis in the plan view, and
the second imaginary line is a straight line passing through the first bonding member and the second bonding member,
wherein in the plan view, the first bonding member and the second bonding member are positioned outside a first area formed by extending the first excitation electrode along the X axis, and are arranged with the first area interposed between the first bonding member and the second bonding member.

8. The resonator device according to claim 7, wherein the substrate includes a silicon substrate.

9. A resonator module comprising:
the resonator device according to claim 7; and
an oscillation circuit oscillating the resonator element.

10. An electronic apparatus comprising:
the resonator device according to claim 7.

11. A vehicle comprising:
the resonator device according to claim 7.

12. A resonator device comprising:
a quartz crystal substrate including a first surface and a second surface that are in a front-rear relationship with each other and are provided along an X axis which is an electrical axis;
a resonator element including
a first excitation electrode arranged on the first surface,
a second excitation electrode arranged on the second surface in opposition to the first excitation electrode,
a first pad electrode that is arranged on the first surface and is electrically coupled to the first excitation electrode, and
a second pad electrode that is arranged on the first surface and is electrically coupled to the second excitation electrode;
a base including
a substrate, and
a first interconnect and a second interconnect arranged on the substrate;
a first bonding member bonding the first pad electrode to the first interconnect; and
a second bonding member bonding the second pad electrode to the second interconnect, wherein
in plan view of the quartz crystal substrate,
the first bonding member is positioned on one side of a first imaginary line,
the second bonding member overlaps with the first imaginary line or is positioned on the other side of the first imaginary line, and
40°<θ1<80° or 100°<θ1<140°, where
θ1 is an angle formed between the first imaginary line and a second imaginary line,
the first imaginary line is a straight line that passes through a centroid of the resonator element and is parallel to the X axis in the plan view, and
the second imaginary line is a straight line passing through the first bonding member and the second bonding member,
wherein in the plan view, the first bonding member and the second bonding member are positioned outside a second area formed by extending the first excitation electrode along an axis orthogonal to the X axis, and are positioned on the same side with respect to the second area.

13. The resonator device according to claim 12, wherein the substrate includes a silicon substrate.

14. A resonator module comprising:
the resonator device according to claim 12; and
an oscillation circuit oscillating the resonator element.

15. An electronic apparatus comprising:
the resonator device according to claim 12.

16. A vehicle comprising:
the resonator device according to claim 12.

* * * * *